US010964758B2

(12) United States Patent
Yan et al.

(10) Patent No.: US 10,964,758 B2
(45) Date of Patent: Mar. 30, 2021

(54) PIXEL UNIT, DISPLAY PANEL, DISPLAY DEVICE AND METHOD OF MANUFACTURING PIXEL UNIT

(71) Applicant: BOE TECHNOLOGY GROUP CO., LTD., Beijing (CN)

(72) Inventors: Guang Yan, Beijing (CN); Wenjun Hou, Beijing (CN); Juanjuan You, Beijing (CN); Donghui Yu, Beijing (CN); Chunjing Hu, Beijing (CN); Yongqi Shen, Beijing (CN); Dongfang Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/613,133

(22) PCT Filed: Apr. 8, 2019

(86) PCT No.: PCT/CN2019/081660
§ 371 (c)(1),
(2) Date: Nov. 13, 2019

(87) PCT Pub. No.: WO2019/201104
PCT Pub. Date: Oct. 24, 2019

(65) Prior Publication Data
US 2020/0227490 A1 Jul. 16, 2020

(30) Foreign Application Priority Data
Apr. 19, 2018 (CN) .......................... 201810353698.3

(51) Int. Cl.
*H01L 27/32* (2006.01)
*H01L 33/24* (2010.01)
(Continued)

(52) U.S. Cl.
CPC .......... *H01L 27/3218* (2013.01); *H01L 33/06* (2013.01); *H01L 33/24* (2013.01); *H01L 51/56* (2013.01); *H01L 2933/0033* (2013.01)

(58) Field of Classification Search
CPC ............... H01L 27/3218; H01L 27/326; H01L 2933/0033; H01L 33/06; H01L 33/24; H01L 51/56; H01L 51/5209
See application file for complete search history.

(56) References Cited

U.S. PATENT DOCUMENTS 6,366,025 B1   4/2002   Yamada
8,309,947 B2  11/2012   Vaufrey
(Continued)

FOREIGN PATENT DOCUMENTS

CN    101543135 A    9/2009
CN    104409647 A    3/2015
(Continued)

OTHER PUBLICATIONS

Zhanghao; "OLED inkjet printing process, detailed data and details"; Source: OLEDindustry; May 12, 2017.
(Continued)

*Primary Examiner* — Herve-Louis Y Assouman
(74) *Attorney, Agent, or Firm* — Calfee, Halter & Griswold LLP

(57) ABSTRACT

A pixel unit, a display panel, a display device and a method of manufacturing a pixel unit. The pixel unit includes a first sub-pixel unit and a second sub-pixel unit, each sub-pixel unit includes a first electrode, an emission layer, and a second electrode stacked on a substrate. An emission lifespan of the emission layer of the first sub-pixel unit is smaller than that of the emission layer of the second sub-pixel unit. An area of an orthographic projection of the emission layer of the first sub-pixel unit on the substrate is equal to that of
(Continued)

the emission layer of the second sub-pixel unit on the substrate. An area of an orthographic projection of the first electrode of the first sub-pixel unit on the substrate is greater than an area of an orthographic projection of the first electrode of the second sub-pixel unit on the substrate.

20 Claims, 3 Drawing Sheets

(51) Int. Cl.
    *H01L 51/56*     (2006.01)
    *H01L 51/52*     (2006.01)
    *H01L 33/06*     (2010.01)

(56) References Cited

U.S. PATENT DOCUMENTS

| | | |
|---|---|---|
| 9,450,028 B2 | 9/2016 | Chou et al. |
| 2004/0201558 A1* | 10/2004 | Arnold ................ H01L 27/3213 345/83 |
| 2005/0218792 A1* | 10/2005 | Jianpu ................ H01L 27/3213 313/502 |
| 2006/0017375 A1* | 1/2006 | Noguchi ............. H01L 27/3279 313/504 |
| 2009/0272999 A1 | 11/2009 | Yoshida et al. |
| 2012/0235178 A1 | 9/2012 | Mori |
| 2016/0035802 A1 | 2/2016 | Wang et al. |
| 2016/0293683 A1* | 10/2016 | Hou ...................... H01L 51/001 |
| 2017/0162829 A1* | 6/2017 | Lai ...................... H01L 51/5234 |
| 2017/0365646 A1 | 12/2017 | Bai et al. |
| 2018/0241009 A1 | 8/2018 | Liu |

FOREIGN PATENT DOCUMENTS

| | | |
|---|---|---|
| CN | 105070739 A | 11/2015 |
| CN | 106505159 A | 3/2017 |
| CN | 108573998 A | 9/2018 |
| EP | 1032045 A2 | 8/2000 |
| JP | 2005166691 A | 6/2005 |

OTHER PUBLICATIONS

First Office Action for Chinese Patent Application No. 201810353698.3 dated Mar. 11, 2020.

* cited by examiner

PIXEL UNIT, DISPLAY PANEL, DISPLAY DEVICE AND METHOD OF MANUFACTURING PIXEL UNIT

RELATED APPLICATIONS

The present application is a 35 U.S.C. 371 national stage application of a PCT International Application No. PCT/CN2019/081660, filed on Apr. 8, 2019, which claims the benefit of Chinese Patent Application No. 201810353698.3, filed on Apr. 19, 2018, the contents of which are incorporated herein by reference in their entireties.

FIELD

The present disclosure relates to the field of display technologies, and in particular to a pixel unit, a display panel, a display device, and a method of manufacturing a pixel unit.

BACKGROUND

An Organic Light-Emitting Diode (OLED) display panel comprises a plurality of pixel units arranged in an array. Each pixel unit comprises sub-pixel units of different colors. The emission layers of the sub-pixel units may have different rates of attenuation over time, which may cause the color shift of the pixel unit with aging.

SUMMARY

According to an exemplary embodiment, there is provided a pixel unit, comprising a first sub-pixel unit and a second sub-pixel unit, each of which comprises a first electrode, an emission layer, and a second electrode stacked on a substrate in a direction away from the substrate, wherein an emission lifespan of the emission layer of the first sub-pixel unit is smaller than an emission lifespan of the emission layer of the second sub-pixel unit, wherein an area of an orthographic projection of the emission layer of the first sub-pixel unit on the substrate is equal to an area of an orthographic projection of the emission layer of the second sub-pixel unit on the substrate, and wherein an area of an orthographic projection of the first electrode of the first sub-pixel unit on the substrate is greater than an area of an orthographic projection of the first electrode of the second sub-pixel unit on the substrate.

In some exemplary embodiments, the pixel unit further comprises a third sub-pixel unit which comprises a first electrode, an emission layer, and a second electrode stacked on the substrate in the direction away from the substrate, wherein an emission lifespan of the emission layer of the third sub-pixel unit is greater than the emission lifespan of the emission layer of the second sub-pixel unit, wherein an area of an orthographic projection of the emission layer of the third sub-pixel unit on the substrate is equal to the area of the orthographic projection of the emission layer of the second sub-pixel unit on the substrate, and wherein an area of an orthographic projection of the first electrode of the third sub-pixel unit on the substrate is less than the area of the orthographic projection of the first electrode of the second sub-pixel unit on the substrate.

In some exemplary embodiments, the second sub-pixel unit further comprises an insulator connected between the emission layer of the second sub-pixel unit and the substrate.

In some exemplary embodiments, at least one sub-pixel unit of the second sub-pixel unit and the third sub-pixel unit further comprises an insulator connected between the emission layer of the at least one sub-pixel unit and the substrate.

In some exemplary embodiments, in the sub-pixel unit comprising the insulator, an orthographic projection of the insulator on the substrate and the orthographic projection of the first electrode on the substrate do not overlap, and wherein a sum of an area of the orthographic projection of the insulator on the substrate and the area of the orthographic projection of the first electrode on the substrate is equal to the area of the orthographic projection of the emission layer on the substrate.

In some exemplary embodiments, in the sub-pixel unit comprising the insulator, a thickness of the insulator in a direction perpendicular to the substrate is the same as a thickness of the first electrode in the direction perpendicular to the substrate.

In some exemplary embodiments, in the sub-pixel unit comprising the insulator, a shape of the orthographic projection of the insulator on the substrate comprises a ring and the orthographic projection of the first electrode on the substrate is surrounded by an inner edge of the ring.

In some exemplary embodiments, in the sub-pixel unit comprising the insulator, the orthographic projection of the insulator on the substrate is arranged at two opposite sides of the orthographic projection of the first electrode on the substrate in a direction from the first sub-pixel unit to the second sub-pixel unit.

In some exemplary embodiments, in any one of the first sub-pixel unit and the second sub-pixel unit, an orthographic projection of a geometric center of the first electrode on the substrate overlaps with an orthographic projection of a geometric center of the emission layer on the substrate.

According to an exemplary embodiment, there is provided a display panel, comprising the pixel unit according to any one of the embodiments of the present disclosure.

According to an exemplary embodiment, there is provided a display device, comprising the display panel according to any one of the embodiments of the present disclosure.

According to an exemplary embodiment, there is provided a method of manufacturing a pixel unit, comprising: providing a substrate; forming a first electrode of a first sub-pixel unit and a first electrode of a second sub-pixel unit on the substrate, wherein the area of an orthographic projection of the first electrode of the first sub-pixel unit on the substrate is greater than an area of an orthographic projection of the first electrode of the second sub-pixel unit on the substrate; and forming a first emission layer on the first electrode of the first sub-pixel unit and a second emission layer on the first electrode of the second sub-pixel unit, wherein an emission lifespan of the first emission layer is smaller than an emission lifespan of the second emission layer, and an area of an orthographic projection of the first emission layer on the substrate is equal to an area of an orthographic projection of the second emission layer on the substrate.

In some exemplary embodiments, the method further comprises: forming an insulator of the second sub-pixel unit on the substrate, after forming the first electrode of the first sub-pixel unit and the first electrode of the second sub-pixel unit on the substrate, wherein forming the first emission layer on the first electrode of the first sub-pixel unit and the second emission layer on the first electrode of the second sub-pixel unit comprises: forming the first emission layer on the first electrode of the first sub-pixel unit and the second emission layer on the first electrode and the insulator of the second sub-pixel unit, wherein the area of the orthographic projection of each one of the first emission layer and the second emission layer on the substrate is equal to a sum of an area of an orthographic projection of the insulator of the second sub-pixel unit on the substrate and the area of the orthographic projection of the first electrode of the second sub-pixel unit on the substrate.

In some exemplary embodiments, forming the first electrode of the first sub-pixel unit and the first electrode of the second sub-pixel unit on the substrate comprises: forming the first electrode of the first sub-pixel unit, the first electrode of the second sub-pixel unit and a first electrode of a third sub-pixel unit on the substrate, wherein an area of an orthographic projection of the first electrode of the third sub-pixel unit on the substrate is smaller than the area of the orthographic projection of the first electrode of the second sub-pixel unit on substrate, wherein forming the first emission layer on the first electrode of the first sub-pixel unit and the second emission layer on the first electrode of the second sub-pixel unit comprises: forming the first emission layer on the first electrode of the first sub-pixel unit, the second emission layer on the first electrode of the second sub-pixel unit and a third emission layer on the first electrode of the third sub-pixel unit, wherein an emission lifespan of the third emission layer is greater than the emission lifespan of the second emission layer, and an area of an orthographic projection of the third emission layer on the substrate is equal to the area of the orthographic projection of the second emission layer on the substrate.

In some exemplary embodiments, the method further comprises: forming at least one of an insulator of the second sub-pixel unit and an insulator of the third sub-pixel unit on the substrate, after forming the first electrode of the first sub-pixel unit, the first electrode of the second sub-pixel unit and the first electrode of the third sub-pixel unit on the substrate, wherein forming the first emission layer on the first electrode of the first sub-pixel unit, the second emission layer on the first electrode of the second sub-pixel unit and the third emission layer on the first electrode of the third sub-pixel unit comprises: forming a corresponding one of at least one of the second emission layer and the third emission layer on the at least one of the insulator of the second sub-pixel unit and the insulator of the third sub-pixel unit on the substrate, wherein the area of the orthographic projection of the corresponding one of at least one of the second emission layer and the third emission layer on the substrate is equal to a corresponding one of at least one of: a sum of the area of the orthographic projection of the insulator of the second sub-pixel unit on the substrate and the area of the orthographic projection of the first electrode of the second sub-pixel unit on the substrate, and a sum of the area of the orthographic projection of the insulator of the third sub-pixel unit on the substrate and the area of the orthographic projection of the first electrode of the third sub-pixel unit on the substrate.

BRIEF DESCRIPTION OF THE DRAWINGS

These and other aspects of the disclosure are apparent from and will be further elucidated, by way of example, with reference to the drawings, in which.

DETAILED DESCRIPTION

Figure 1:
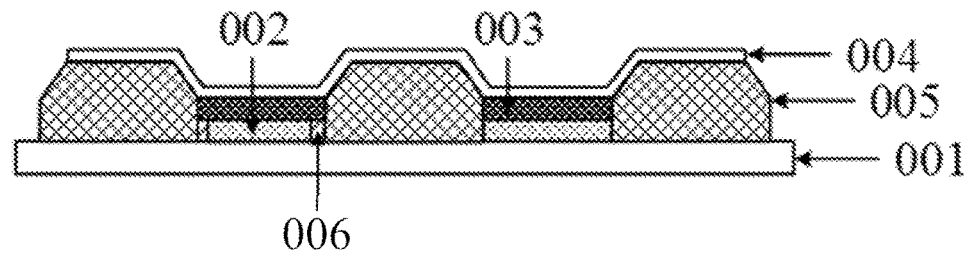
FIG. 1 schematically illustrates a structure of a pixel unit in accordance with an exemplary embodiment.

Several exemplary embodiments will be described in more detail below with reference to the drawings in order to enable those skilled in the art to implement the present disclosure. However, the present application may be embodied in many different forms and should not be construed as being limited to the exemplary embodiments set forth herein. Instead, the exemplary embodiments are provided so that this disclosure will be thorough and complete and the scope of the present application is delivered to those skilled in the art sufficiently. The described exemplary embodiments do not limit the disclosure. Further, the terms used in the detailed description for the specific embodiments shown in the drawings are not intended to limit the disclosure.

Comparing with liquid crystal displays, OLED displays have the advantages of self-luminescence, fast response, wide viewing angle, high brightness, bright colors, light weight and thin thickness. An OLED display panel usually comprises a plurality of pixel units arranged in an array. Each pixel unit comprises at least two sub-pixel units of different colors. For example, each pixel unit may comprise a red (R) sub-pixel unit, a green (G) sub-pixel unit, and a blue (B) sub-pixel unit. Each sub-pixel unit comprises an anode, a cathode, and an emission layer between the anode and the cathode, and the like. The emission layer may comprise a plurality of stacked film layers. For example, the film layers of the emission layer may comprise a hole injection layer, a hole transport layer, an emission material layer, an electron transport layer, an electron injection layer, and the like, and the emission layer may comprise one or more of these film layers and other layer structures.

The material properties of the emission materials of various colors determine their emission lifespan (i.e., the attenuation rate), which may cause the color shift of the display panel with aging. To this end, a method is to differently set the areas of the sides of the emission layers of the various sub-pixel units of different colors closer to the substrate. Specifically, for the various sub-pixel units of different colors, the area of the emission layer that is less susceptible to aging is set to be smaller than the area of the emission layer that is more susceptible to aging. Thus, under the same current, the current density of the emission layer that is less susceptible to aging is larger, so that the difference in the actual attenuation rates of the emission layers of different colors is minimized.

The methods for producing the film layers of the emission layer in the organic electroluminescent device mainly comprise vacuum evaporation and solution processes. The vacuum evaporation is suitable for the film formation of organic small molecular materials, and has the advantages of good film formation uniformity and relatively high maturity. However, the device of vacuum evaporation is expensive, and the vacuum evaporation has a low material utilization rate, and low alignment accuracy when manufacturing large-sized products. The solution processes comprise spin coating, ink printing, and nozzle coating, etc. They are more suitable for film formation of polymeric materials and soluble small molecules. The cost of the device of solution processes is low, and the solution processes have outstanding advantages in large-scale and massive production.

When a solution process is used to fabricate a film layer in an emission layer, the drying condition of the solution varies depending on the area of the side of the emission layer closer to the substrate. For example, in the case where the areas of the sides of the emission layers of the various sub-pixel units of one pixel unit closer to the substrate are different, different sub-pixel units require different drying conditions to manufacture the same kind of film layer in the various emission layers. Therefore, the same kind of film layer in different sub-pixel units has to be manufactured separately, which results in a longer manufacturing time and a lower production efficiency for the panel.

The present disclosure provides a pixel unit. FIG. 1 schematically illustrates the structure of a pixel unit in accordance with an exemplary embodiment. As shown in FIG. 1, the pixel unit may comprise a first sub-pixel unit and a second sub-pixel unit. Each of the first sub-pixel unit and the second sub-pixel unit comprises a first electrode 002, an emission layer 003, and a second electrode 004 that are stacked on a substrate 001 in a direction away from the substrate 001. In some exemplary embodiments, the first electrode 002 can be an anode and the second electrode 004 can be a common cathode. It should be noted that the display panel may further comprise a pixel defining layer 005. The pixel defining layer 005 is configured to define a plurality of pixel units and the sub-pixel units in each pixel unit on the substrate. The emission lifespan of the emission layer of the first sub-pixel unit is smaller than the emission lifespan of the emission layer of the second sub-pixel unit. The term "emission lifespan" refers to a predicted life during which the emission layer can operate within a certain degree of attenuation as desired by the designer. The "emission lifespan" reflects the material property of the emission layer. The area of the orthographic projection of the emission layer 003 of the first sub-pixel unit on the substrate 001 is equal to the area of the orthographic projection of the emission layer 003 of the second sub-pixel unit on the substrate 001. The above exemplary embodiment could be understood in such a way that the sides of the emission layers 003 of different sub-pixel units closer to the substrate 001 have the same area, so that the drying conditions of the emission layers of the different sub-pixel units of different colors are the same. Therefore, the emission layers of the different sub-pixel units of different colors can be made in a same manufacturing step simultaneously. Meanwhile, the area of the orthographic projection of the first electrode 002 of the first sub-pixel unit on the substrate 001 is larger than the area of the orthographic projection of the first electrode 002 of the second sub-pixel unit on the substrate 001. In other words, the areas of the contacting surfaces between the first electrodes 002 and the emission layers 003 of different sub-pixel units are different, and in the sub-pixel unit having the emission layer with a smaller emission lifespan, the area of the contacting surface between the emission layer and the first electrode is larger.

According to the light-emitting principle of the emission layer 003, only the portion of the emission layer 003 that is in contact with the first electrode 002 emits light, and the portion of the emission layer 003 that is not in contact with the first electrode 002 does not emit light. Therefore, although the areas of the emission layers of the different sub-pixel units are the same, the areas of the actual light-emitting portions of the different emission layers 003 are different. Under the same voltage/current, the currents per unit area of the different emission layers 003 (i.e., the current densities) are different. It is known that a larger current density results in a faster attenuation rate and a shorter emission lifespan. Therefore, by making the emission layer with a smaller emission lifespan correspond to the first electrode with a larger contacting surface, the actual attenuation rates of the different emission layers can be made as equal as possible, thereby making the actual emission lifespan of the emission materials of different colors as equal as possible. Therefore, it is possible to overcome the problem of color shift with aging of the display panel caused by the difference in the emission lifespan of the emission material, which, in turn, enhance the display panel's display effect and lifespan. For example, when the actual light-emitting area of the emission layer 003 having a large attenuation rate is larger than the actual light-emitting area of the emission layer 003 having a smaller attenuation rate, the current density of the emission layer 003 having a larger actual light-emitting area is smaller, so the difference between the emission lifespan of the emission layer 003 having a larger actual light-emitting area and the emission lifespan of the emission layer 003 having a smaller actual light-emitting area is reduced.

In summary, the emission layers of the sub-pixel units of different colors of the display panel according to the exemplary embodiments have a substantially same drying condition, so the emission layers in the different sub-pixel units can be simultaneously manufactured, thus shortening the manufacturing time of the display panel and increasing the manufacturing efficiency. Moreover, the emission lifespans of the emission layers of different sub-pixel units are adapted to overcome the problem of color shift with aging.

It should be understood that in the art of display panel, the width of the film is generally significantly greater than its height. Therefore, for the sake of simplicity, the upper and lower surfaces of the film layer in the present application are described as having the same width. However, the actual scope of this description does not exclude the exemplary embodiments in which the widths of the upper and lower surfaces may be different. For example, unless otherwise defined, the orthographic projection of the first electrode on the substrate should be understood as the orthographic projection of the side of the first electrode away from the substrate on the substrate, and the orthographic projection of the insulator on the substrate should be understood as the orthographic projection of the surface of the insulator away from the substrate on the substrate. The term "the orthographic projection of the emission layer on the substrate" or similar terms should be interpreted in terms of context. For example, when this term relates to a comparison with the area of the first electrode (and the insulator), it can be interpreted as the orthographic projection of the surface of the emission layer closer to the substrate on the substrate. When this term relates to the drying conditions of the emission layer, it may refer to either an orthographic projection of the surface away from the substrate or an orthographic projection of the surface closer to the substrate, depending on the drying technique employed.

The emission layer 003 may comprise an emission material layer. Accordingly, the emission lifespan of the emission layer 003 depends on the emission lifespan of the emission material. Therefore, in the sub-pixel units of different colors, the area of the contacting surface between the first electrode 002 and the emission layer 003 is inversely related to the emission lifespan of the emission material of the corresponding color.

Figure 2:
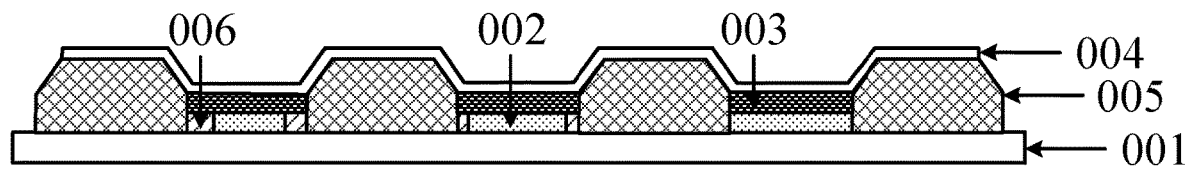
FIG. 2 schematically illustrates a structure of another pixel unit in accordance with an exemplary embodiment.

FIG. 2 schematically illustrates a structure of another pixel unit in accordance with an exemplary embodiment. The pixel unit may also comprise a third sub-pixel unit, and the emission lifespan of the emission layer of the third sub-pixel unit is greater than the emission lifespan of the emission layer of the second sub-pixel unit. That is, the emission lifespan of the emission material of the first sub-pixel unit, the emission lifespan of the emission material of the second sub-pixel unit, and the emission lifespan of the emission material of the third sub-pixel unit are incremental. The area of the orthographic projection of the first electrode of the third sub-pixel unit on the substrate is smaller than the area of the orthographic projection of the first electrode of the second sub-pixel unit on the substrate. That is, the area of the first electrode of the first sub-pixel unit, the area of the first electrode of the second sub-pixel unit, and the area of the first electrode of the third sub-pixel unit are declined. That is, in the first sub-pixel unit, the second sub-pixel unit and the third sub-pixel unit, the areas of the contacting surfaces of the first electrodes 002 and the emission layers 003 are incremental. In some exemplary embodiments, the first color can be red, the second color can be green, and the third color can be blue.

In some exemplary embodiments, a portion of the sub-pixel units in a pixel unit can comprise an insulator 006 connected between the emission layer 003 and the substrate 001. Both the insulator 006 and the first electrode 002 are in physical contact with the emission layer 003. In some exemplary embodiments, for example, as shown in FIG. 1, an insulator 006 is connected between the substrate and the emission layer of the second sub-pixel unit. In other exemplary embodiments, in a pixel unit comprising three sub-pixel units, at least one sub-pixel unit may comprise an insulator 006 connected between the emission layer 003 and the substrate 001. For example, at least one of the second sub-pixel unit and the third sub-pixel unit has an insulator connected between the emission layer and the substrate. Specifically, as shown in FIG. 2, an insulator is connected between the substrate and the emission layer of the second sub-pixel unit, and an insulator is connected between the substrate and the emission layer of the third sub-pixel unit. The insulator 006 effectively ensures that the actual light-emitting areas of the emission layers 003 of different colors are different, and ensures the flatness of the film layer.

In order to ensure the balance of the force of the first electrode 002 and the insulator 006 applied to the different positions of the film layer disposed on them, the material of the first electrode 002 and the material of the insulator 006 may be electrically different, but other characteristics of the materials (for example, the surface hydrophilic and hydrophobic characteristics of the layer structure, etc.) may be the same. For example, the material of the first electrode 002 may be indium tin oxide (ITO), and the material of the insulator 006 may be silicon nitride ($SiN_x$), silicon oxynitride ($SiO_xN_y$) or silicon oxide ($SiO_x$).

Figure 3:
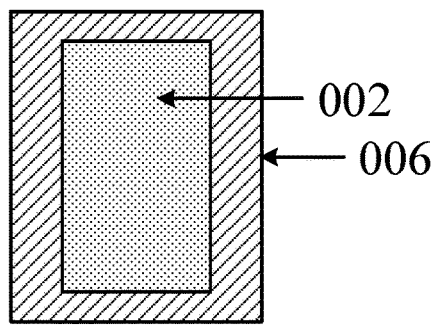
FIG. 3 schematically illustrates an arrangement of the insulator and the first electrode in a pixel unit in accordance with an exemplary embodiment.

FIG. 3 schematically illustrates an arrangement of the insulator 006 and the first electrode 002. Referring to FIG. 3, in a sub-pixel unit having an insulator 006, the shape of a cross section of the insulator 006 parallel to the substrate 001 is a ring. That is, the orthographic projection of the insulator 006 on the plane of the substrate 001 is a ring. The shape of ring projection may comprise a rectangular ring shape, a circular ring shape, or the like. In FIG. 3, the shape of ring projection is specifically a rectangular ring shape. Correspondingly, the shape of the contacting surface of the insulator 006 and the emission layer 003 is also a ring.

The orthographic projection of the insulator 006 on the substrate 001 does not overlap with the orthographic projection of the first electrode 002 on the substrate 001. That is, the insulator 006 is placed side by side with the first electrode 002, and is not present on the surface of the first electrode 002 facing the substrate 001 or facing the emission layer 003. The sum of the area of the orthographic projection of the insulator on the substrate and the area of the orthographic projection of the first electrode on the substrate is equal to the area of the orthographic projection of the emission layer on the substrate. In other words, in a sub-pixel unit, in the space defined by the substrate 001, the emission layer 003 and the pixel defining layer 005, only the first electrode and the insulator exist. In some exemplary embodiments, the thickness of the insulator in a direction perpendicular to the substrate 001 is the same as the thickness of the first electrode in the direction perpendicular to the substrate 001. In some exemplary embodiments, the first electrode 002 is located within the inner edge of the ring.

Figure 4:
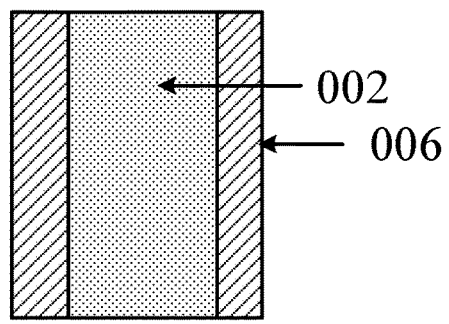
FIG. 4 schematically illustrates an arrangement of the insulator and the first electrode in a pixel unit in accordance with another exemplary embodiment.

FIG. 4 schematically illustrates another arrangement of the insulator 006 and the first electrode 002. Referring to FIG. 4, in a sub-pixel unit having an insulator 006, the orthographic projection of the insulator on the substrate is arranged at the opposite sides of the orthographic projection of the first electrode on the substrate along a direction from the first sub-pixel unit to the second sub-pixel unit. That is, the insulator 006 comprises two portions, and in the viewing angle of FIG. 4, the two portions of the insulator 006 are respectively disposed on two opposite sides of the first electrode 002. In some exemplary embodiments, the orthographic projection of the contacting surface of the first electrode 002 and the emission layer 003 is a rectangle, and the orthographic projection of the contacting surfaces of the insulator 006 and the emission layer 003 (i.e., the orthographic projections of the two portions of the insulator) are distributed at the opposite two sides of the rectangular orthographic projection of the first electrode.

In some exemplary embodiments, the orthographic projection of the geometric center of the first electrode 002 on the substrate overlaps with the orthographic projection of the geometric center of the emission layer 003 on the substrate. The higher the coincidence degree of the geometric center of the first electrode 002 and the geometric center of the emission layer 003, the better the luminous stability of the emission layer 003, and the better the display stability of the display panel.

In order to improve the stability of the illumination of the display panel, in each sub-pixel unit having an insulator 006, the orthographic projection of the insulator 006 on the substrate 001 does not overlap with the orthographic projection of the first electrode 002 on the substrate 001, and the sum of the area the orthographic projection of the surface of the insulator 006 away from the substrate on the substrate 001 and the area of the orthographic projection of the surface of the first electrode 002 away from the substrate on the substrate 001 is equal to the area of the orthographic projection of the surface of the emission layer of the sub-pixel unit closer to the substrate on the substrate 001. That is, the first electrode 002 and the insulator 006 are disposed in the same layer, and the combination formed by the first electrode 002 and the insulator 006 completely covers the entire surface of the emission layer closer to the substrate 001.

In some exemplary embodiments, the thickness of the insulator 006 may be the same as the thickness of the first electrode 002, such that the film layer (e.g., the emission layer 003) disposed on both the first electrode 002 and the insulator 006 has the same thickness at its different locations. In this way, the portions of the film layer at different locations are subjected to the same electric field force, which can improve the uniformity of the display of the panel and improve the stability of the illumination of the display panel.

In summary, since the areas of the surfaces of the emission layers in different sub-pixel units closer to the substrate are the same, the drying conditions of the emission layers in different sub-pixel units are substantially the same, the emission layers in the different sub-pixel units of different colors can be manufactured simultaneously in exemplary embodiments. Moreover, the actual light-emitting areas of the different emission layers are adapted, so that the current density of the emission material with smaller emission lifespan is also smaller, such that the difference in the emission lifespan of different emission materials is reduced. Therefore, on the basis of ensuring the display lifespan of the display panel, the manufacturing time of the display panel is shortened, and the production efficiency is improved.

In accordance with another exemplary embodiment, there is provided a display panel, comprising the pixel unit in accordance with an exemplary embodiment.

In accordance with still another exemplary embodiment, there is provided a display device comprising the display panel according to an exemplary embodiment.

Figure 5A:
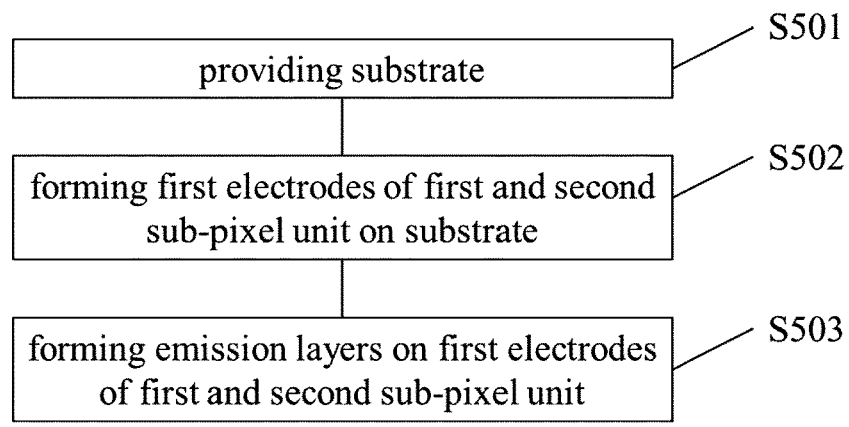
FIG. 5A-FIG. 5D schematically illustrate flow charts of a method of manufacturing a pixel unit in accordance with an exemplary embodiment.

In accordance with still another exemplary embodiment, there is provided a method of manufacturing a pixel unit. FIG. 5A schematically illustrates a flow chart of a method in accordance with an exemplary embodiment. The method can comprise the following steps:

providing a substrate (step S501), forming the first electrode of the first sub-pixel unit and the first electrode of the second sub-pixel unit on the substrate (step S502), wherein the area of the orthographic projection of the first electrode of the first sub-pixel unit on the substrate is greater than the area of the orthographic projection of the first electrode of the second sub-pixel unit on the substrate; and forming emission layers respectively on the first electrode of the first sub-pixel unit and the first electrode of the second sub-pixel unit (step S503), wherein the emission lifespan of the emission layer of the first sub-pixel unit is less than the emission lifespan of the emission layer of the second sub-pixel unit, and the area of the orthographic projection of the emission layer of the first sub-pixel unit on the substrate is equal to the area of the orthographic projection of the emission layer of the second sub-pixel unit on the substrate.

For brevity, the emission layer of first sub-pixel unit could also be called the first emission layer and the emission layer of second sub-pixel unit could also be called the second emission layer somewhere in this disclosure.

In some exemplary embodiments, a layer of transparent conductive material having a certain thickness may be deposited on the substrate by magnetron sputtering or thermal evaporation to obtain a first conductive film layer. The first conductive film layer is then processed by a patterning process to obtain the first electrodes. The areas of the orthographic projections of the first electrodes of different sub-pixel units on the substrate are different. The specific area of the first electrode depends on the emission lifespan of the emission layer to be formed thereon. If the emission lifespan of the emission layer is long, the area of the orthographic projection of the electrode is small. The patterning process may comprise: photoresist coating, exposure, development, etching, and photoresist stripping. The transparent conductive material may be ITO, and the thickness of the first electrode may be set according to actual needs. For example, the first electrode may have a thickness of 50 nm to 150 nm. The substrate may be a transparent substrate, and may specifically be made of a light-guiding and non-metallic material having certain hardness such as glass, quartz, or transparent resin.

Figure 6:
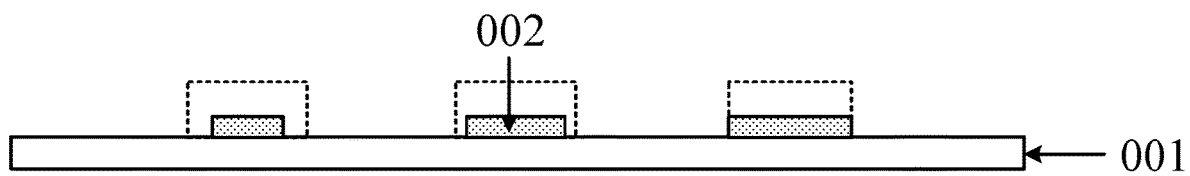
FIG. 6-FIG. 8 schematically illustrate the structures of the pixel unit in different stages of the method of manufacturing the pixel unit according to an exemplary embodiment.

FIG. 6 schematically illustrates the structure of the substrate after the finish of step S502. The first electrodes 002 are formed on the substrate 001. As can be seen from FIG. 6, the areas of the orthographic projections of the first electrodes 002 of the different sub-pixel units on the substrate 001 are different. The dotted lines in FIG. 6 schematically illustrate the widths of the emission layers to be formed.

It should be noted that a thin film transistor (TFT) array for driving the sub-pixel units to emit light can be formed in or beneath the substrate. For example, the substrate 001 may be a planarization layer or a similar structure.

After the first electrodes are formed, a pixel defining layer may be formed on the substrate where the first electrodes have been formed. The pixel defining layer defines a plurality of pixel units arranged in an array on the substrate. Each pixel unit comprises at least two sub-pixel units. The areas of the sides of the sub-pixel units closer to the substrate are the same.

The method of forming a pixel defining layer may refer to the related technologies, and details are not described herein again. The height of the pixel defining layer can be adjusted according to actual needs. For example, the height of the pixel defining layer can be approximately 1 micron.

The width of the bank of the pixel defining layer is adjusted with reference to the width of the emission layer such that when the emission layer is formed, the area of the orthographic projection of the emission layer on the substrate satisfies the above mentioned relationship with respect to the first electrode.

Figure 7:
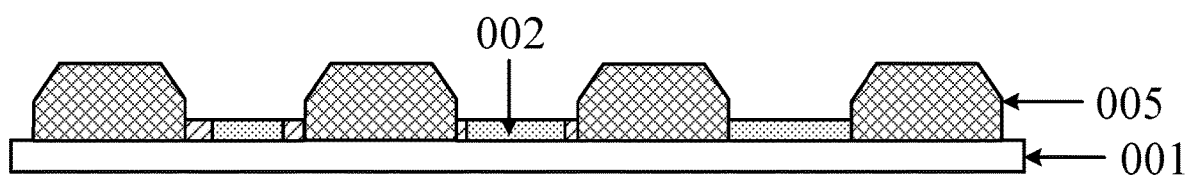

FIG. 7 schematically shows the structure of the substrate after the pixel defining layer 005 has been formed on the substrate 001 with the first electrodes 002 being already formed. As can be seen in FIG. 7, the area of the side of each sub-pixel unit closer to the substrate is the same.

After the pixel defining layer being formed, the emission layers may be formed on the first electrodes (step S503). The emission lifespan of the emission layer of the first sub-pixel unit is smaller than the emission lifespan of the emission layer of the second sub-pixel unit, and the area of the orthographic projection of the emission layer of the first sub-pixel unit on the substrate is equal to the area of the orthographic projection of the emission layer of the second sub-pixel unit on the substrate.

In some exemplary embodiments, an organic emission layer may comprise at least a hole injection layer, a hole transport layer, an emission material layer, an electron transport layer, an electron injection layer, and the like, and the thickness of each film layer may be set according to actual needs. The electron transport layer, the electron injection layer, and the like can be formed by a method such as thermal evaporation, etc. The hole injection layer, the hole transport layer, and the emission material layer of different sub-pixel units may be formed by solution processes (for example, ink printing, coating, spin coating, screen printing, etc.). Each pixel unit comprises at least two sub-pixel units of different colors, and the areas of the contacting surfaces of the first electrodes and the emission layers of the sub-pixel units of different colors are different. In some exemplary embodiments, the area of the contacting surface of the first electrode and the emission layer may be inversely correlated with the emission lifespan of the emission layer. For example, in the case where the pixel unit comprises the first sub-pixel unit, the second sub-pixel unit and the third sub-pixel unit, the emission lifespan of the emission material of the first sub-pixel unit, the emission lifespan of the emission material of the second sub-pixel unit and the emission lifespan of the emission material of the third sub-pixel unit are incremental, and correspondingly, the area of the contacting surface of the first electrode and the emission layer of the first sub-pixel unit, the area of the contacting surface of the first electrode and the emission layer of the second sub-pixel unit, and the area of the contacting surface of the first electrode and the emission layer of the third sub-pixel unit decrease progressively.

Figure 8:
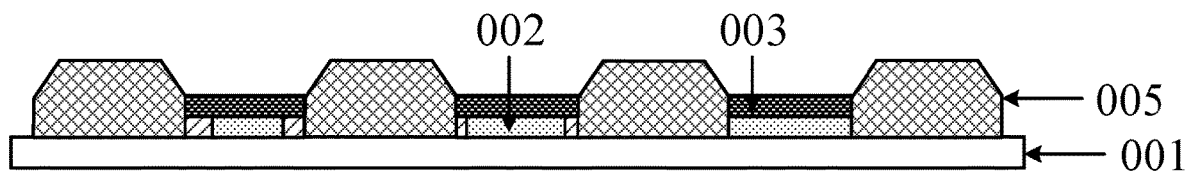

FIG. 8 schematically shows the structure of the substrate after the formation of the emission layer 003 on the substrate 001 having the first electrode 002 and the pixel defining layer 005. As can be seen from FIG. 8, the areas of the contacting surface of the first electrodes 002 and the emission layers 003 of the different sub-pixel units are different.

After the formation of the emission layer, a second electrode 004 is formed on the substrate on which the emission layers have been formed. The method of forming the second electrode may be referred to the related technologies, and details are not described herein again.

The pixel unit manufactured by the above method comprises the first sub-pixel unit and the second sub-pixel unit, each of which comprises the first electrode, the emission layer, and the second electrode stacked on the substrate in a direction away from the substrate. The emission lifespan of the emission layer of the first sub-pixel unit is smaller than the emission lifespan of the emission layer of the second sub-pixel unit, the area of the orthographic projection of the emission layer of the first sub-pixel unit on the substrate is equal to the area of the orthographic projection of the emission layer of the second sub-pixel unit on the substrate. The area of the orthographic projection of the first electrode of the first sub-pixel unit on the substrate is greater than the area of the orthographic projection of the first electrode of the second sub-pixel unit on the substrate. Since the contacting area of the first electrode and the emission layer of a larger emission lifespan is relatively small, the attenuation rates of the emission layers are adapted, and the color shift with aging of the pixel is alleviated. Moreover, since the areas of the sides of different sub-pixel units closer to the substrate are the same, the areas of the sides of the emission layers of the sub-pixel units closer to the substrate are the same. Therefore, the emission layers of the sub-pixel units of different colors require the same drying conditions, so that the emission layers of the sub-pixel units of different colors can be simultaneously manufactured. Comparing with the related technologies, the manufacturing time of the display panel is shortened, and the production efficiency is improved, while the display effect and lifespan of the display panel remain.

Figure 5B:
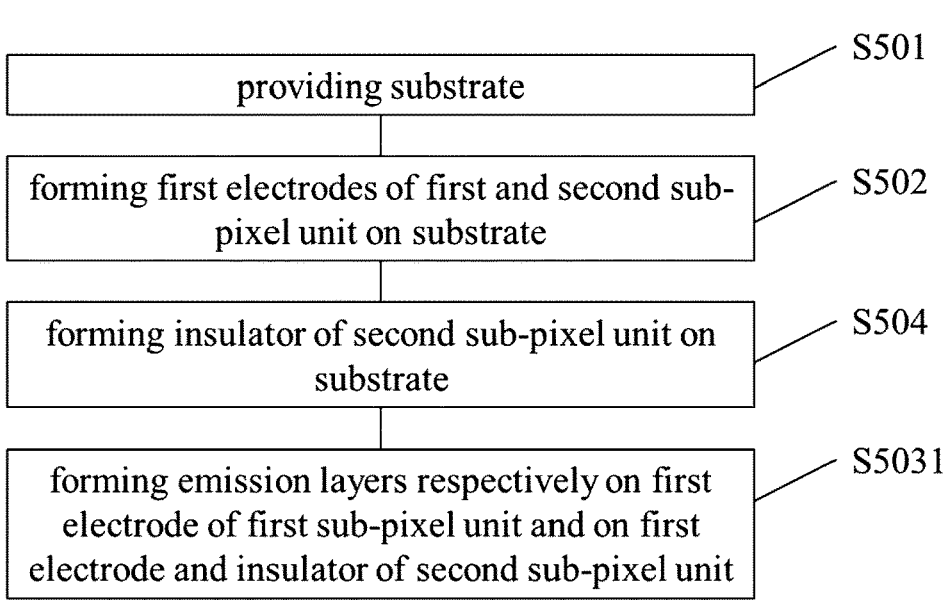

FIG. 5B schematically illustrates a flow chart of another method in accordance with an exemplary embodiment. In this method, after forming the first electrodes (and before forming the pixel defining layer), insulators may also be formed on the substrate on which the first electrodes have been formed. Specifically, the method comprises forming an insulator of the second sub-pixel unit on the substrate (step S504) in the case where the area of the orthographic projection of the first electrode of the first sub-pixel unit on the substrate is greater than the area of the orthographic projection of the first electrode of the second sub-pixel unit on the substrate. The insulator and the first electrode are in the same layer and are both in contact with the emission layer. In different sub-pixel units, the areas of the contacting surfaces of the first electrodes and the emission layers are different.

In this case, step S503 comprises forming an emission layer on the first electrode of the first sub-pixel unit and forming another emission layer on the first electrode and the insulator of the second sub-pixel unit (step S5031), wherein the area of the orthographic projection of the emission layer of the second sub-pixel unit on the substrate is equal to the sum of the area of the orthographic projection of insulator of the second sub-pixel unit on the substrate and the area of the orthographic projection of first electrode of the second sub-pixel unit on the substrate. The area of the emission layer of the first sub-pixel unit is the same as the area of the emission layer of the second sub-pixel unit, and the sum of the area of the first electrode of the second sub-pixel unit and the area of the insulator of the second sub-pixel unit is equal to the area of the emission layer of the second sub-pixel unit.

An insulating film layer can be obtained by forming a layer of insulating material having a certain thickness by for example magnetron sputtering, thermal evaporation or plasma enhanced chemical vapor deposition (PECVD), etc. The insulating film layer is then processed by a patterning process to obtain the insulators.

In some exemplary embodiments, the orthographic projection of the contacting surface of the insulator and the emission layer on the substrate 001 has a ring shape, and the orthographic projection of the contacting surface of the first electrode and the emission layer on the substrate is located inside the ring.

In some exemplary embodiments, the orthographic projection of the contacting surface of the first electrode and the emission layer on the substrate 001 has a rectangular shape, and the insulator is disposed on two opposite sides of the first electrode in the direction from the first sub-pixel unit to the second sub-pixel unit. That is, the orthographic projection of the contacting surface of the insulator and the emission layer on the substrate comprises two parts that are distributed on opposite sides of the rectangular orthographic projection of the first electrode.

In some exemplary embodiments, in the sub-pixel unit having an insulator, the orthographic projection of the insulator on the substrate does not overlap with the orthographic projection of the first electrode on the substrate, and the sum of the area of the orthographic projection of the insulator on the substrate and the area of the orthographic projection of the first electrode on the substrate is equal to the area of the orthographic projection of that sub-pixel unit on the substrate. Also, the thickness of the insulator may be the same as the thickness of the first electrode.

Figure 5C:
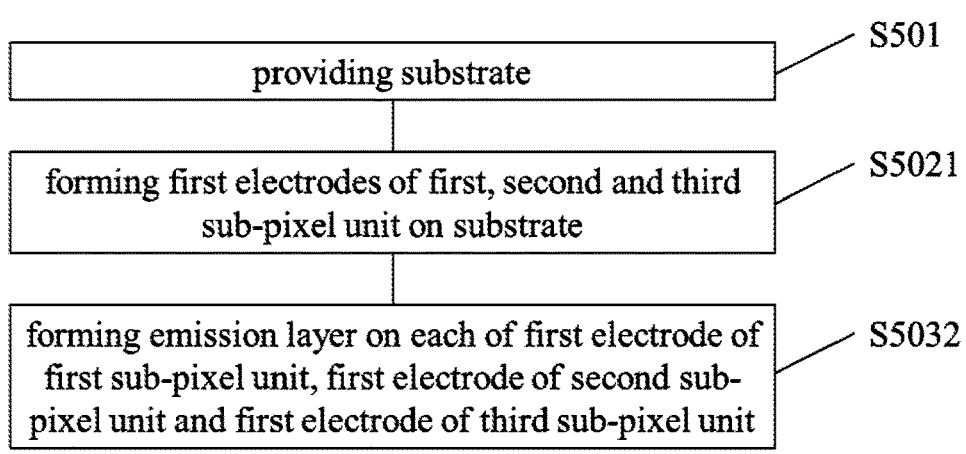

The method according to an exemplary embodiment is suitable for manufacturing a pixel unit comprising three sub-pixel units. FIG. 5C schematically illustrates a flow chart of yet another method for manufacturing a pixel unit in accordance with an exemplary embodiment. As shown in FIG. 5C, step S502 may comprise forming the first electrode of the first sub-pixel unit, the first electrode of the second sub-pixel unit, and the first electrode of the third sub-pixel unit on the substrate (step S5021), wherein the area of the orthographic projection of the first electrode of the third sub-pixel unit on the substrate is smaller than the area of the orthographic projection of the first electrode of the second sub-pixel unit on the substrate. In this case, step S503 may comprise forming an emission layer on the first electrode of the first sub-pixel unit, forming another emission layer on the first electrode of the second sub-pixel unit, and forming yet another emission layer on the first electrode of the third sub-pixel unit (step S5032). The emission lifespan of the emission layer of the third sub-pixel unit is greater than the emission lifespan of the emission layer of the second sub-pixel unit, and the area of the orthographic projection of the first emission layer of the third sub-pixel unit on the substrate is equal to the area of the orthographic projection of the emission layer of the second sub-pixel unit on the substrate.

Figure 5D:
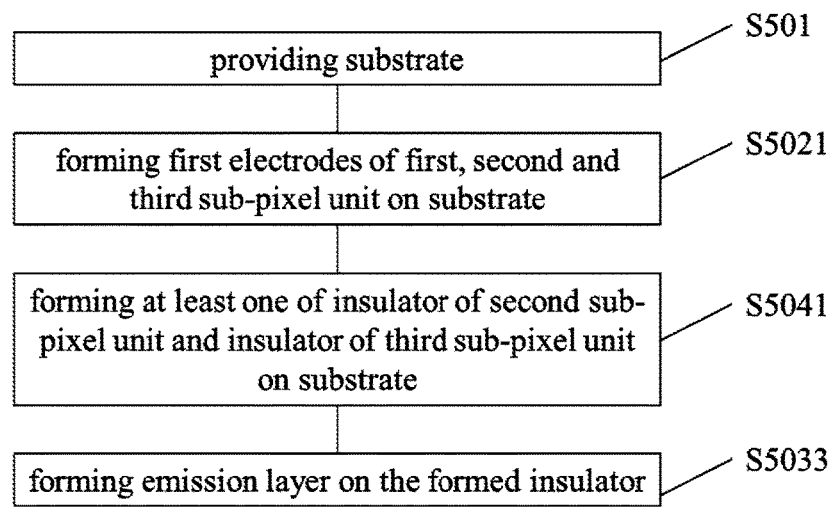

FIG. 5D schematically illustrates a flow chart of still another method for manufacturing a pixel unit in accordance with an exemplary embodiment. As shown in FIG. 5D, step S504 may be replaced with the step of forming at least one of the insulator of the second sub-pixel unit and the insulator of the third sub-pixel unit on the substrate (step S5041). In this case, step S5032 may comprise forming an emission layer on the formed insulator (step S5033), wherein an area of the orthographic projection of the formed emission layer on the substrate is equal to the area of the orthographic projections of the insulator and the first electrode covered by the formed emission layer on the substrate.

In summary, the present disclosure provides a pixel unit, a display panel, a display device, and a method of manufacturing a pixel unit. The pixel unit comprises at least two sub-pixel units of different colors. Each sub-pixel unit comprises the first electrode, the emission layer, and the second electrode stacked on the substrate in a direction away from the substrate. The emission lifespan of the emission layer of the first sub-pixel unit is smaller than the emission lifespan of the emission layer of the second sub-pixel unit. The area of the orthographic projection of the emission layer of the first sub-pixel unit on the substrate is equal to the area of the orthographic projection of the emission layer of the second sub-pixel unit on the substrate. The area of the orthographic projection of the first electrode of the first sub-pixel unit on the substrate is greater than the area of the orthographic projection of the first electrode of the second sub-pixel unit on the substrate. Since the area of the first electrode corresponding to the emission layer of the smaller emission lifespan is larger than the area of the first electrode corresponding to the emission layer of the longer emission lifespan, the attenuation rates of the emission layers are adapted, and the color shift with aging of the pixel unit is weakened. Moreover, since the areas of the sides of the emission layers of the sub-pixel units closer to the substrate are the same, the drying conditions required for the emission layers of the different sub-pixel units are substantially the same, so that the emission layers of the different sub-pixel units can be simultaneously manufactured. Therefore, while ensuring the display effect and lifespan of the display panel, the manufacturing time of the display panel is shortened, and the production efficiency is improved.

The display devices provided by the exemplary embodiments may comprise the display panels according to the embodiments of the present disclosure. The display device can be any device with a display function, such as a liquid crystal panel, an electronic paper, a mobile phone, a tablet computer, a television, a display, a laptop computer, a digital photo frame, a navigator, and the like. For example, the display panel can be an OLED display panel or a Quantum Dot Light Emitting Diodes (QLED) display panel.

It should be noted that the above-mentioned exemplary embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than the listed elements or steps. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage. Furthermore, the terms first, second, third and the like in the description and in the claims, are used for distinguishing between similar elements and not necessarily for describing a sequential or chronological order. It is to be understood that the terms so used are interchangeable under appropriate circumstances and that the exemplary embodiments of the invention described herein are capable of operation in other sequences than described or illustrated herein.

We claim:

1. A pixel unit, comprising a first sub-pixel unit and a second sub-pixel unit, each of which comprises a first electrode, an emission layer, and a second electrode stacked on a substrate in a direction away from the substrate,
   wherein an emission lifespan of the emission layer of the first sub-pixel unit is smaller than an emission lifespan of the emission layer of the second sub-pixel unit,
   wherein an area of an orthographic projection of the emission layer of the first sub-pixel unit on the substrate is equal to an area of an orthographic projection of the emission layer of the second sub-pixel unit on the substrate, and
   wherein an area of an orthographic projection of the first electrode of the first sub-pixel unit on the substrate is greater than an area of an orthographic projection of the first electrode of the second sub-pixel unit on the substrate.

2. The pixel unit of claim 1, further comprising a third sub-pixel unit which comprises a first electrode, an emission layer, and a second electrode stacked on the substrate in the direction away from the substrate,
   wherein an emission lifespan of the emission layer of the third sub-pixel unit is greater than the emission lifespan of the emission layer of the second sub-pixel unit,
   wherein an area of an orthographic projection of the emission layer of the third sub-pixel unit on the substrate is equal to the area of the orthographic projection of the emission layer of the second sub-pixel unit on the substrate, and
   wherein an area of an orthographic projection of the first electrode of the third sub-pixel unit on the substrate is less than the area of the orthographic projection of the first electrode of the second sub-pixel unit on the substrate.

3. The pixel unit of claim 1, wherein the second sub-pixel unit further comprises an insulator connected between the emission layer of the second sub-pixel unit and the substrate.

4. The pixel unit of claim 2, wherein at least one sub-pixel unit of the second sub-pixel unit and the third sub-pixel unit further comprises an insulator connected between the emission layer of the at least one sub-pixel unit and the substrate.

5. The pixel unit of claim 3, wherein in the second sub-pixel unit, an orthographic projection of the insulator on the substrate and the orthographic projection of the first electrode on the substrate do not overlap, and
   wherein a sum of an area of the orthographic projection of the insulator on the substrate and the area of the orthographic projection of the first electrode on the substrate is equal to the area of the orthographic projection of the emission layer on the substrate.

6. The pixel unit of claim 5, wherein in the second sub-pixel unit, a thickness of the insulator in a direction perpendicular to the substrate is the same as a thickness of the first electrode in the direction perpendicular to the substrate.

7. The pixel unit of claim 5, wherein in the second sub-pixel unit, a shape of the orthographic projection of the insulator on the substrate comprises a ring and the orthographic projection of the first electrode on the substrate is surrounded by an inner edge of the ring.

8. The pixel unit of claim 5, wherein in the second sub-pixel unit, the orthographic projection of the insulator on the substrate is arranged at two opposite sides of the orthographic projection of the first electrode on the substrate in a direction from the first sub-pixel unit to the second sub-pixel unit.

9. The pixel unit of claim 1, wherein in any one of the first sub-pixel unit and the second sub-pixel unit, an orthographic projection of a geometric center of the first electrode on the substrate overlaps with an orthographic projection of a geometric center of the emission layer on the substrate.

10. A display panel, comprising the pixel unit according to claim 1.

11. The pixel unit of claim 4, wherein in the at least one sub-pixel unit of the second sub-pixel unit and the third sub-pixel unit, an orthographic projection of the insulator on the substrate and the orthographic projection of the first electrode on the substrate do not overlap, and
wherein a sum of an area of the orthographic projection of the insulator on the substrate and the area of the orthographic projection of the first electrode on the substrate is equal to the area of the orthographic projection of the emission layer on the substrate.

12. The pixel unit of claim 11, wherein in the at least one sub-pixel unit of the second sub-pixel unit and the third sub-pixel unit, a thickness of the insulator in a direction perpendicular to the substrate is the same as a thickness of the first electrode in the direction perpendicular to the substrate.

13. The pixel unit of claim 11, wherein in the at least one sub-pixel unit of the second sub-pixel unit and the third sub-pixel unit, a shape of the orthographic projection of the insulator on the substrate comprises a ring and the orthographic projection of the first electrode on the substrate is surrounded by an inner edge of the ring.

14. The pixel unit of claim 11, wherein in the at least one sub-pixel unit of the second sub-pixel unit and the third sub-pixel unit, the orthographic projection of the insulator on the substrate is arranged at two opposite sides of the orthographic projection of the first electrode on the substrate in a direction from the first sub-pixel unit to the second sub-pixel unit.

15. The pixel unit of claim 1, further comprising a pixel defining layer defining the first sub-pixel unit and the second sub-pixel unit,
wherein a size of an orthographic projection of an aperture of the first sub-pixel unit on the substrate is equal to a size of an orthographic projection of an aperture of the second sub-pixel unit on the substrate.

16. A display device, comprising the display panel of claim 10.

17. A method of manufacturing a pixel unit, comprising:
providing a substrate;
forming a first electrode of a first sub-pixel unit and a first electrode of a second sub-pixel unit on the substrate, wherein the area of an orthographic projection of the first electrode of the first sub-pixel unit on the substrate is greater than an area of an orthographic projection of the first electrode of the second sub-pixel unit on the substrate; and
forming a first emission layer on the first electrode of the first sub-pixel unit and a second emission layer on the first electrode of the second sub-pixel unit, wherein an emission lifespan of the first emission layer is smaller than an emission lifespan of the second emission layer, and an area of an orthographic projection of the first emission layer on the substrate is equal to an area of an orthographic projection of the second emission layer on the substrate.

18. The method of claim 17, further comprising:
forming an insulator of the second sub-pixel unit on the substrate, after forming the first electrode of the first sub-pixel unit and the first electrode of the second sub-pixel unit on the substrate,
wherein forming the first emission layer on the first electrode of the first sub-pixel unit and the second emission layer on the first electrode of the second sub-pixel unit comprises:
forming the first emission layer on the first electrode of the first sub-pixel unit and the second emission layer on the first electrode and the insulator of the second sub-pixel unit, wherein the area of the orthographic projection of each one of the first emission layer and the second emission layer on the substrate is equal to a sum of an area of an orthographic projection of the insulator of the second sub-pixel unit on the substrate and the area of the orthographic projection of the first electrode of the second sub-pixel unit on the substrate.

19. The method of claim 17, wherein forming the first electrode of the first sub-pixel unit and the first electrode of the second sub-pixel unit on the substrate comprises:
forming the first electrode of the first sub-pixel unit, the first electrode of the second sub-pixel unit and a first electrode of a third sub-pixel unit on the substrate, wherein an area of an orthographic projection of the first electrode of the third sub-pixel unit on the substrate is smaller than the area of the orthographic projection of the first electrode of the second sub-pixel unit on substrate,
wherein forming the first emission layer on the first electrode of the first sub-pixel unit and the second emission layer on the first electrode of the second sub-pixel unit comprises:
forming the first emission layer on the first electrode of the first sub-pixel unit, the second emission layer on the first electrode of the second sub-pixel unit and a third emission layer on the first electrode of the third sub-pixel unit, wherein an emission lifespan of the third emission layer is greater than the emission lifespan of the second emission layer, and an area of an orthographic projection of the third emission layer on the substrate is equal to the area of the orthographic projection of the second emission layer on the substrate.

20. The method of claim 19, further comprising:
forming at least one of an insulator of the second sub-pixel unit and an insulator of the third sub-pixel unit on the substrate, after forming the first electrode of the first sub-pixel unit, the first electrode of the second sub-pixel unit and the first electrode of the third sub-pixel unit on the substrate, wherein forming the first emission layer on the first electrode of the first sub-pixel unit, the second emission layer on the first electrode of the second sub-pixel unit and the third emission layer on the first electrode of the third sub-pixel unit comprises:

forming a corresponding one of at least one of the second emission layer and the third emission layer on the at least one of the insulator of the second sub-pixel unit and the insulator of the third sub-pixel unit on the substrate, wherein the area of the orthographic projection of the corresponding one of at least one of the second emission layer and the third emission layer on the substrate is equal to a corresponding one of at least one of:

a sum of the area of the orthographic projection of the insulator of the second sub-pixel unit on the substrate and the area of the orthographic projection of the first electrode of the second sub-pixel unit on the substrate, and a sum of the area of the orthographic projection of the insulator of the third sub-pixel unit on the substrate and the area of the orthographic projection of the first electrode of the third sub-pixel unit on the substrate.

* * * * *